United States Patent [19]

Ichinose

[11] 4,278,903
[45] Jul. 14, 1981

[54] PHASE COMPARISON CIRCUIT

[75] Inventor: Kazuaki Ichinose, Yokohama, Japan

[73] Assignee: Tokyo Shibaura Denki Kabushiki Kaisha, Kawasaki, Japan

[21] Appl. No.: 31,399

[22] Filed: Apr. 19, 1979

[30] Foreign Application Priority Data

Apr. 28, 1978 [JP] Japan .................................. 53-51987
Jan. 24, 1979 [JP] Japan .................................. 54-6119

[51] Int. Cl.³ ............................................. H03K 5/26
[52] U.S. Cl. .................................. 307/514; 307/516; 307/246; 328/133
[58] Field of Search .................. 307/232, 233, 246; 328/133, 134

[56] References Cited

U.S. PATENT DOCUMENTS

| | | | |
|---|---|---|---|
| 3,509,476 | 4/1970 | Roth ........................................ | 328/134 |
| 3,585,508 | 6/1971 | Crowther ............................. | 328/134 |
| 3,714,463 | 1/1973 | Laune .................................... | 307/232 |
| 3,721,833 | 3/1973 | Kramer ................................. | 307/232 |
| 3,863,080 | 1/1975 | Steckler .......................... | 307/232 X |

*Primary Examiner*—John S. Heyman

*Attorney, Agent, or Firm*—Oblon, Fisher, Spivak, McClelland & Maier

[57] ABSTRACT

A phase comparison circuit comprises a phase difference signal producing circuit receiving a reference signal and variable frequency signal to produce a high level signal over a time period corresponding to the phase difference between both the signals, a discharge signal producing circuit for producing a high level signal a predetermined time after the high level signal of the phase difference signal producing circuit is completed, a first switching circuit connected in series with a capacitor and adapted to be closed in response to the high level signal from the phase difference signal producing circuit to enable the capacitor to be charged, a second switching circuit adapted to be closed in response to the high level signal from the discharge signal producing circuit to enable the capacitor to be discharged, a transistor having a base-to-emitter path connected to the capacitor, and a third switching circuit adapted to be closed in response to the variable frequency signal and ground the emitter of the transistor through a resistor, in which a voltage signal proportional to the phase difference between the reference signal and the variable frequency signal is produced from the emitter of the transistor.

22 Claims, 9 Drawing Figures

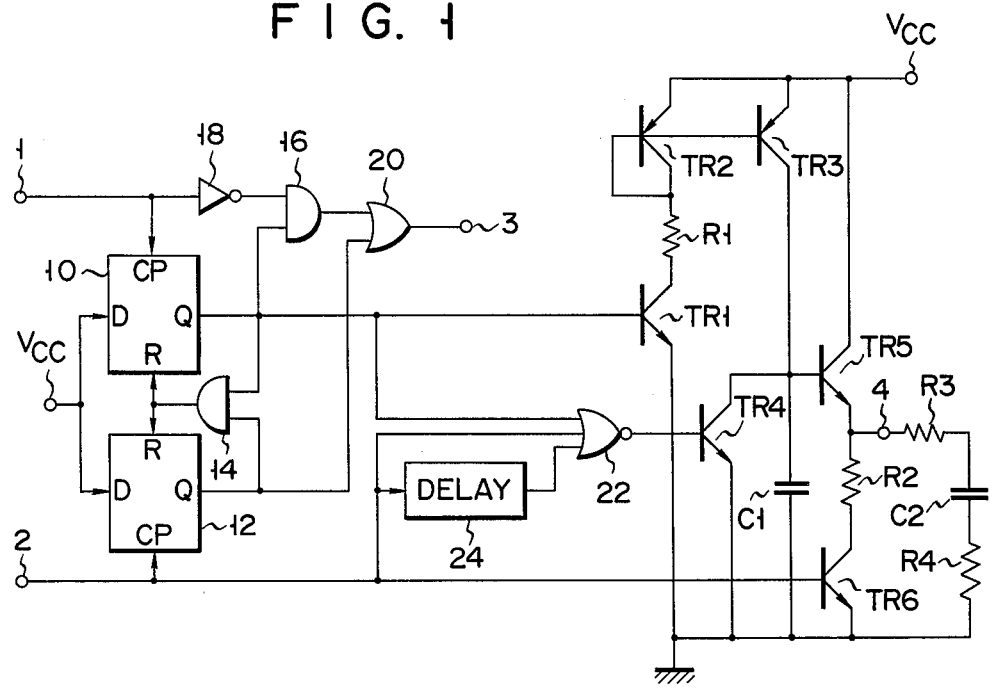
FIG. 1
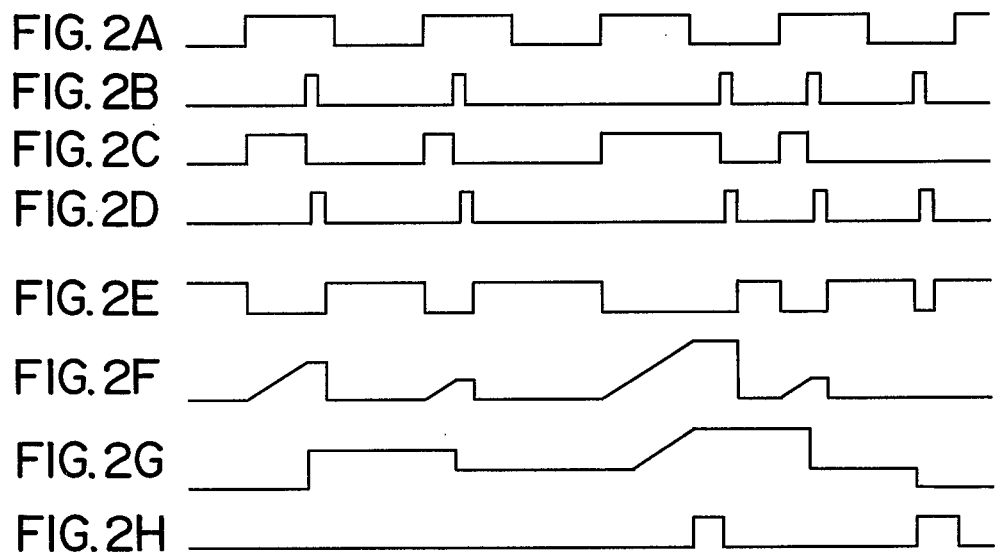
FIG. 2A
FIG. 2B
FIG. 2C
FIG. 2D
FIG. 2E
FIG. 2F
FIG. 2G
FIG. 2H

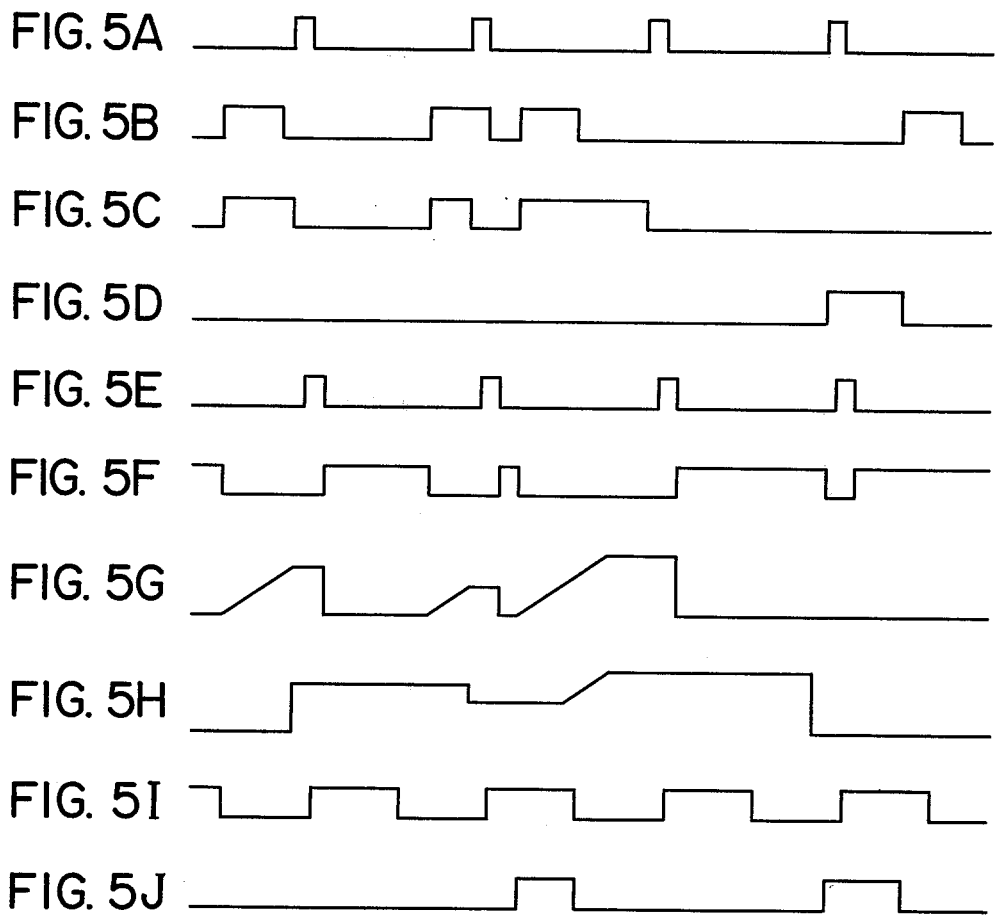
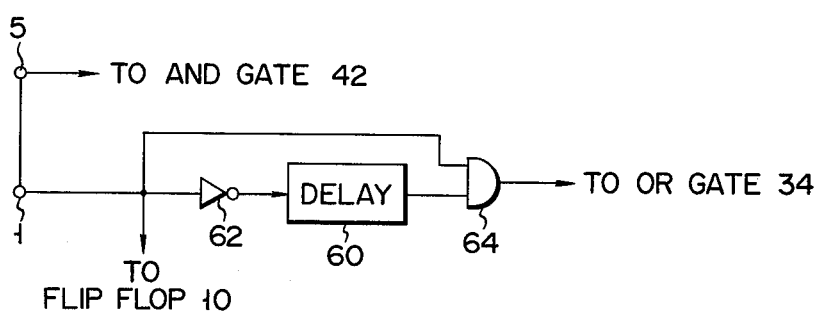

FIG. 7A
FIG. 7B
FIG. 7C
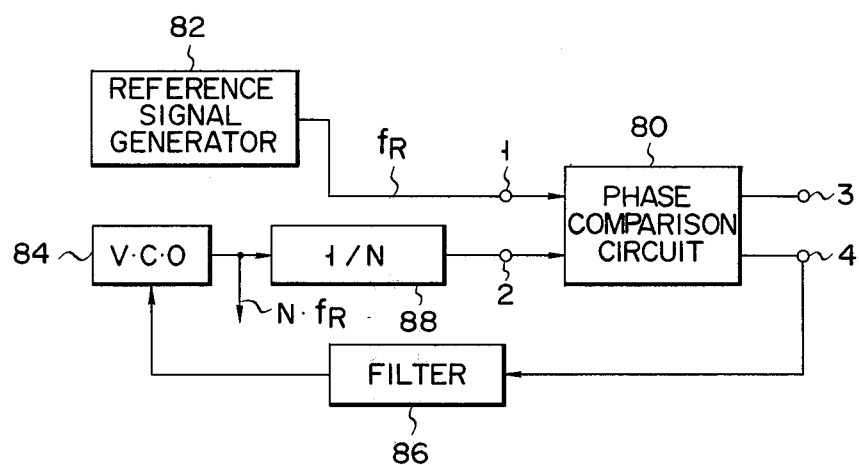
FIG. 8
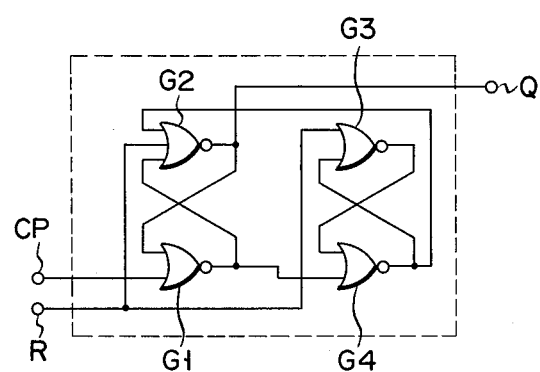
FIG. 9

PHASE COMPARISON CIRCUIT

BACKGROUND OF THE INVENTION

This invention relates to a digital type phase comparison circuit for use in a phase lock type synthesizer etc.

The digital type phase comparison circuit compares the phase of a reference frequency signal with that of a variable frequency signal and produces an output signal corresponding to an amount of phase leading or lagging of the variable frequency signal ahead or behind the reference frequency signal. The digital type phase comparison circuit, when incorporated into a phase lock loop, is required that it take a high impedance state when the phases of the reference frequency signal and variable frequency signal are in a lock condition and that it have a linear output characteristic such that an output voltage is linearly increased as a phase difference between the reference frequency signal and the variable frequency signal is increased in a predetermined range.

In the conventional phase comparison circuit an amount of phase leading or lagging of the variable frequency signal ahead or behind the reference frequency signal is detected by a corresponding separate logic circuit and for this reason there is a possibility that the amount of such phase leading or lagging is detected in a different ratio due to variation in the operation characteristic of each logic circuit, for example, a difference in a delay time inherent in each logic gate to be used. In consequence, the output characteristic of the phase comparison circuit may include a discontinuous point or the phase comparison circuit ceases to show any linearity, thus prominently lowering a phase lock function.

SUMMARY OF THE INVENTION

It is accordingly the object of this invention to provide a phase comparison circuit for producing an output signal which linearly varies as a phase difference between two input signals varies.

According to one embodiment of this invention there is provided a phase comparison circuit comprising first signal generating means for producing in response to first and second input signals an output signal having a time interval corresponding to a phase difference between the two input signals, second signal generating means for producing an output signal a predetermined time after the output signal of the first signal generating means is terminated, charge storing means, charging means connected to the charge storing means and adapted to be enabled by the output signal of the first signal generating means to permit the charge storing means to be charged, discharging means connected to the charging means and adapted to be enabled by the output signal of the second signal generating means to permit the charge storing means to be discharged, and a transistor having a base connected to the storing means for producing from the emitter thereof an output signal corresponding to an amount of charge stored in the charge storing means.

BRIEF DESCRIPTION OF THE DRAWINGS

FIG. 1 is a circuit diagram showing a phase comparison circuit according to one embodiment of this invention;

FIG. 2 is a signal waveform diagram for explaining the operation of the phase comparison circuit of FIG. 1;

FIG. 5 is a signal waveform diagram for explaining the operation of the phase comparison circuit of FIG. 4;

FIG. 6 shows an arrangement of a pulse width conversion circuit for changing a duty cycle of the reference frequency signal supplied to the phase comparison circuit of FIG. 4;

FIG. 7 is a signal waveform diagram for explaining the operation of a pulse width conversion circuit of FIG. 6;

FIG. 8 is a circuit diagram of a phase lock loop type frequency synthesizer including the phase comparison circuit of FIG. 1 or 4; and FIG. 9 is a circuit diagram of a combination of latch circuit which can be used in place of flip-flop circuits of the phase comparison circuits in FIGS. 1 and 4.

DETAILED DESCRIPTION OF THE INVENTION

Figure 3:
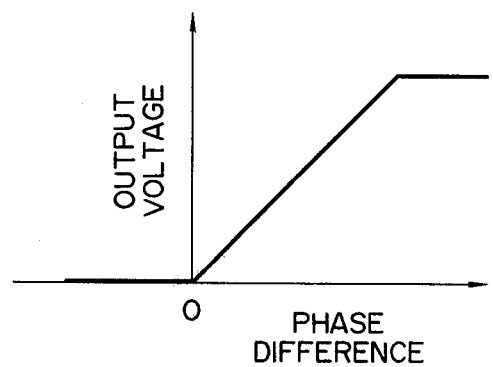
FIG. 3 is a graph illustrating an output characteristic of the phase comparison circuit of FIG. 1.

A phase comparison circuit according to the embodiment of this invention will now be explained below.

A phase comparison circuit as shown in FIG. 1 includes a flip-flop 10 having a clock terminal for receiving a reference frequency signal fR supplied to an input terminal 1 and a flip-flop 12 having a clock terminal for receiving a variable frequency signal fs supplied to an input terminal 2. A power supply terminal $V_{CC}$ is connected commonly to the D input terminals of the flip-flops 10 and 12. The Q output terminals of the flip-flops 10 and 12 are connected respectively to two input terminals of an AND gate 14, the output terminal of which is connected to the reset terminals of the flip-flops 10 and 12. The Q output terminal of the flip-flop 10 is connected to one input terminal of an AND gate 16. The other input terminal of the AND gate 16 receives the reference frequency signal fR through an inverter 18. The output terminal of the AND gate 16 is connected to one input terminal of an OR gate 20. The other input terminal of the OR gate 20 is connected to the Q output terminal of the flip-flop 12 and the output terminal of the OR gate 20 is connected to a first output terminal 3. The Q output terminal of the flip-flop 10 is connected to one input terminal of a NOR gate 22. The other two input terminals of the NOR gate 22 receive the variable frequency signal fs directly and through a delay circuit 24 respectively. The Q output terminal of the flip-flop 10 is also connected to the base of an npn transistor TR1. The emitter of the transistor TR1 is grounded and the collector of the transistor TR1 is connected through a resistor R1 to the emitter and the base of a pnp transistor TR2. The collector of the transistor TR2 is connected to the power supply terminal $V_{CC}$. The base of the transistor TR2 is connected to the base of a pnp transistor TR3. The emitter of the transistor TR3 is connected to the power supply terminal $V_{CC}$ and the collector of the transistor TR3 is grounded through a capacitor C1. That terminal of the capacitor C1 which is connected to the collector of the transistor TR3 is connected to the collector of an npn transistor TR4 and the base of an npn transistor TR5. The base of the transistor TR4 is connected to the output terminal of the NOR gate 22 and the emitter of the transistor TR4 is grounded. The collector of the transistor TR5 is connected to the power supply terminal $V_{CC}$ and the emitter of the transistor TR5 is connected to a second output terminal 4. The emitter of the transistor TR5 is connected through a resistor R2 to the collector of an npn transistor TR6. The base of the transistor TR6 is connected to the input terminal 2 and the emitter of the transistor TR6 is grounded. The output terminal 4 is grounded through an equivalent circuit of a low-pass filter which is constituted of a resistor R3, capacitor C2 and resistor R4.

The operation of the phase comparison circuit of FIG. 1 will be explained below by referring to signal waveforms as shown in FIG. 2.

The reference frequency and variable frequency pulses as shown in FIGS. 2A and 2B respectively are supplied to the clock input terminals of the flip-flops 10 and 12 respectively. When the reference frequency pulse has a phase leading ahead that of the variable frequency pulse within a predetermined range, the flip-flop 10 is first set in response to the leading edge of the reference frequency pulse to produce a high level output signal from the Q output terminal thereof. Then, the flip-flop 12 is set in response to the leading edge of the variable frequency pulse to produce a high level output signal. The high level output signal from the flip-flop 12 is applied to the reset terminal of the flip-flops 10 and 12 through the AND gate 14 which has been enabled by the high level output signal from the flip-flop 10. As a result, the flip-flops 10 and 12 are reset. If in this way the phase of the reference frequency pulse leads ahead that of the variable frequency pulse, a pulse having a width corresponding to a phase difference between the reference frequency and variable frequency signals is produced, as shown in FIG. 2C, from the flip-flop 10.

The output pulse of the flip-flop 10 is supplied to the base of the transistor TR1 to cause the latter to be turned ON. By so doing, a current substantially the same in amount as the current through the transistor TR1 flows through the transistor TR3 to cause the capacitor C1 to be charged as shown in FIG. 2D. The charging of the capacitor C1 is continued until the output signal (FIG. 2C) from the flip-flop 10 becomes a low level to cause the transistor TR1 to be turned OFF. The charging voltage of the capacitor C1 is maintained at the same level until a high level output signal is produced, as shown in FIG. 2F, from the NOR gate 22 which receives the variable frequency pulse (FIG. 2B), an output signal (FIG. 2E) from the delay circuit 24 having a delay time of, for example, half the pulse width of the variable frequency pulse, and the output signal (FIG. 2C) of the flip-flop 10. Thereafter, the capacitor C1 is discharged.

The charging voltage of the capacitor C1 is transferred through the base-to-emitter path of the transistor TR5 to the external circuit. In consequence, a voltage corresponding to a charging voltage of the capacitor C1, that is, a voltage as shown in FIG. 2G is obtained from the output terminal 4. It should be noted that, at the time the charging voltage of the capacitor C1 starts to be transferred to the capacitor C2, the transistor TR6 is turned ON in response to the variable frequency pulse to permit the output voltage at the output terminal 4 to be clamped at a value which is lower than the charging voltage of the capacitor C1 by a forward bias voltage across the base-emitter path of the transistor TR5. Upon completion of the clamping operation, the transistor TR6 is turned OFF in response to the variable frequency pulse so that an impedance between the output terminal 4 and the ground becomes high to maintain the output voltage at a constant level. Each time the variable frequency pulse is produced an output voltage at the output terminal 4 is translated such that it has a level corresponding to a phase difference between the reference frequency pulse and the variable frequency pulse, and maintained constant until the transistor TR6 is turned ON by the next variable frequency pulse.

If the variable frequency pulse has a phase lag more than that corresponding to the high level period of the reference frequency pulse with respect to the reference frequency pulse as indicated in the third pulses of the reference frequency and variable frequency signals of FIGS. 2A and 2B respectively, a phase lockout indicating signal as shown in FIG. 2H is produced from the OR gate 20. That is, a high level output signal is produced from the flip-flop 10 in response to the reference frequency pulse and a high level output signal is produced from the first output terminal 3 through the AND gate 16 and OR gate 20 during the time period from when the reference frequency pulse becomes a low level until the flip-flop 12 is set in response to the variable frequency pulse. In this case, the charging of the capacitor C1 starts when a high level output signal is produced from the flip-flop 10. After lapse of a predetermined time the charging voltage of the capacitor reaches a saturation level.

If the reference frequency pulse has a phase lagging behind the variable frequency pulse as shown in the fifth pulses of the reference frequency and variable frequency signals of FIGS. 2A and 2B, a phase lock-out indicating signal as shown in FIG. 2H is produced from the OR gate 20. That is, the flip-flop 12 is set by the variable frequency pulse to produce a high level output signal. The high level output signal is delivered through the OR gate 20. In this case, since the flip-flop 10 is set by the output signal of the AND gate 14 immediately after it is set in response to the reference frequency pulse, the transistor TR1 is not substantially turned ON and thus the capacitor C1 is not charged. In consequence, the output voltage is held in the "0" level.

As shown in FIG. 3 the output signal of the phase comparison circuit as shown in FIG. 1 becomes a zero level when the reference frequency signal has a phase lagging with respect to the variable frequency signal. When the reference frequency signal has a phase leading of below a predetermined value with respect to the variable frequency signal the output signal of the phase comparison circuit increases in proportion to a phase difference between both the signals and when the reference frequency signal has a phase lagging of about the predetermined value the output signal of the phase comparison circuit is held at a predetermined level i.e. a saturation level.

Figure 4:
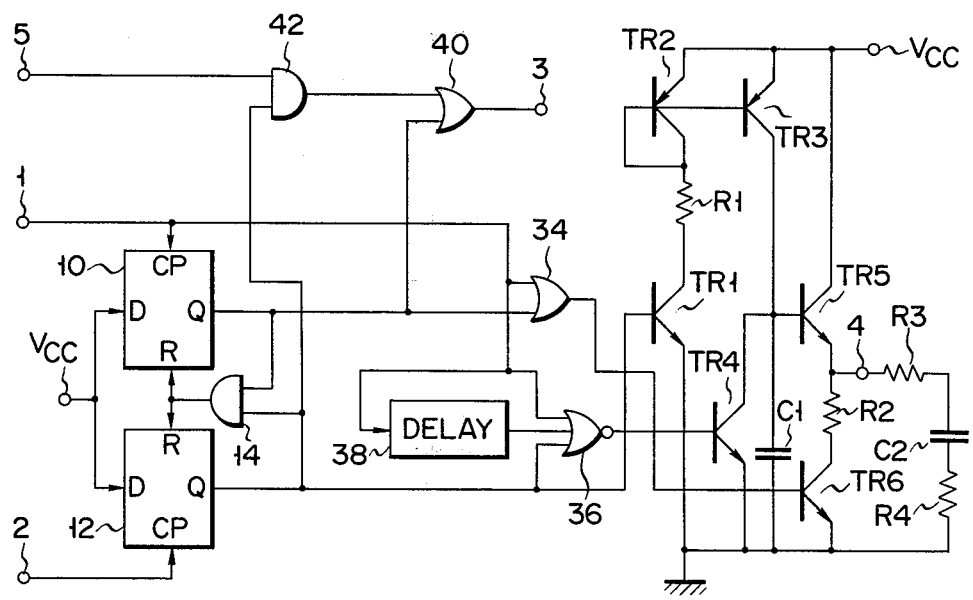
FIG. 4 is a circuit diagram showing a phase comparison circuit according to another embodiment of this invention.

FIG. 4 shws a phase comparison circuit according to another embodiment of this invention. The phase comparison circuit of FIG. 4 produces an output voltage proportional to the reference frequency signal having a predetermined range of phase lagging with respect to the variable frequency signal. In the phase comparison circuit of FIG. 4 the same reference numerals are employed to designate parts or elements corresponding to those shown in FIG. 1 and further explanation thereof is omitted for brevity.

In the phase comparison circuit shown in FIG. 4 flip-flops 10 and 12 are driven, like the embodiment of FIG. 1, by the reference frequency and variable frequency signals and AND gate 14 has its two input terminals connected to the Q output terminals respectively of the flip-flops 10 and 12 and its output terminal connected to the reset-terminals of the flip-flops 10 and 12. A reference frequency signal input terminal 1 is connected to the base of a transistor TR6 through an OR gate 34 of which one input terminal is connected to the Q output terminal of the flip-flop 10. The input terminal 1 is also connected to one input terminal of a NOR gate 36 of which the output terminal is connected to the base of a transistor TR4. The NOR gate 36 has the other two input terminals for receiving the reference frequency signal directly and through a delay circuit 38 respectively. The Q output terminal of the flip-flop 12 is also connected to the base of a transistor TR1 and to one input terminal of an OR gate 40 through an AND gate 42 of which one terminal is connected to an input terminal 5 for receiving a synchronous signal in synchronism with the reference frequency signal. The Q output terminal of the flip-flop 10 is connected to the other input terminal of the OR gate 40.

The operation of the phase comparison circuit of FIG. 4 will now be explained below by referring to a signal wavefrom diagram of FIG. 5.

Reference frequency and variable frequency pulses as shown in FIGS. 5A and 5B are supplied to the clock input terminals of the flip-flops 10 and 12. If the variable frequency pulse has a phase leading ahead the reference frequency pulse the flipflop 12 is first set in response to the leading edge of the variable frequency pulse to produce a high level output signal, as shown in FIG. 5C, from the Q output terminal thereof. Then, the flip-flop 10 is set in response to the leading edge of the reference frequency pulse to produce a high level output signal. The high level output signal is applied through the AND gate 14 to the reset terminals of the flip-flops 10 and 12 to cause the latter to be reset. Where in this way the phase of the variable frequency pulse lags behind that of the reference frequency pulse a pulse having a width corresponding to a phase difference between the variable frequency pulse and the reference frequency pulse is produced, as shown in FIG. 5C, from the flip-flop 12. In this case, a low level output signal as shown in FIG. 5D is produced from the flip-flop 10 and the reference frequency signal is supplied through the OR gate 34 to the base of the transistor TR6. The NOR gate 36 for receiving the reference frequency signal, an output signal (FIG. 5E) of the delay circuit 38 for delaying the reference frequency signal a predetermined time and an output signal (FIG. 5C) from the Q output terminal of the flip-flop 12 supplies an output signal as shown in FIG. 5 to the base of the transistor TR4. By so doing, the same operation as explained in connection with the phase comparison circuit of FIG. 1 is effected and the capacitor C1 is charged as shown in FIG. 5G. The output signal from the output terminal 4 will be as shown in FIG. 5H.

If as indicated in the third pulses of the reference frequency and variable frequency signals of FIGS. 5A and 5B the phase of the variable frequency signal leads a predetermined amount ahead that of the reference frequency signal an output signal as shown in FIG. 5J is produced from the AND gate 42 for receiving an output signal (FIG. 5C) from the output terminal of the flip-flop 12 and synchronous signal (FIG. 5I) and it is taken as a phase lock-out indicating signal from the output terminal 3 through the OR gate 40.

If as indicated in the fourth pulses of the reference frequency and variable frequency signals of FIGS. 5A and 5B the phase of the reference frequency signal leads ahead that of the variable frequency signal an output pulse as shown in FIG. 5D is produced from the Q output terminal of the flip-flop 10 and taken as a phase lock-out indicating signal from the output terminal through the OR gate 40. Where in this way the variable frequency signal has a phase leading a predetermined amount ahead that of the reference frequency signal an output signal proportional to a difference between both the signals is produced.

Although in the phase comparison circuit shown in FIG. 4 the duty cycle of the reference frequency pulse is set to 5 to 20% so as to properly control the turn ON state of the transistor TR6 the reference frequency pulse having a duty cycle of, for example, 50% can be used as in the case of the phase comparison circuit shown in FIG. 1. In this case, the input terminal 1 can be connected to the input terminal 5. A pulse width conversion circuit as shown, for example, in FIG. 6 which produces an output pulse with a duty cycle of 5 to 20% in response to the reference frequency signal is required to properly control the turn ON state of the transistor TR6. That is, with the circuit of FIG. 6 a reference frequency signal with a duty cycle of 50% as shown in FIG. 7A is supplied through an inverter 62 to a delay circuit 60. An AND gate 64 for receiving an output signal (FIG. 7B) of the delay circuit 60 and reference frequency signal produces an output pulse with a duty cycle of 5 to 20% as shown in FIG. 7C. The duty cycle of the output pulse of the AND gate 64 is properly changed by changing the delay time of the delay circuit 60.

In this way, since unwanted low frequency components are advantageously prevented from being produced from the output terminal 4 by controlling the turn ON state of the transistor TR6 the charging voltage of the capacitor C2 of the external low-pass filter can be discharged down to a sufficiently lower level immediately before the charging voltage of the capacitor C1 is transferred to the capacitor C2. Where the reference frequency signal is for example 5 to 30 KHz, a good result is obtained if the duty cycle of a pulse which is supplied to the transistor TR6 is 5 to 20%.

FIG. 8 shows a phase lock type frequency synthesizer including a phase comparator circuit 80 as shown in FIG. 1 or 4.

At an input terminal 1 the phase comparison circuit 80 receives a reference frequency signal of a frequency fR from a reference frequency signal generator 82 including, for example, a crystal oscillator. An output terminal 4 of the phase comparison circuit 80 is connected to a control terminal of a voltage controlled oscillator 84 through a low-pass filter 86 including a capacitor C2 and resistors R3 and R4 as shown in FIGS. 1 and 4. The voltage controlled oscillator 84 is controlled by a control signal supplied through the filter 86 from the phase comparison circuit to produce an output signal of a proper frequency, for example, NxfR. The output signal of the voltage controlled oscillator circuit 84 is connected to, for example, a receiver (not shown) and to an input terminal 2 of the phase comparison circuit 80 through a 1/N frequency divider 88. An output terminal 3 of the phase comparison circuit 80 is connected to, for example, the above-mentioned receiver. The operation of the receiver is stopped when a phase lock-out indicating signal is produced.

Since in the synthesizer shown in FIG. 8 an output signal proportional to a phase difference between the reference frequency signal and the variable frequency signal is obtained from the phase comparison circuit 80 an output signal having a greater S/N ratio is obtained from the voltage controlled oscillator 84.

Although the embodiments of this invention have been explained, this invention is not restricted thereto. In the phase comparison circuit as shown, for example, in FIGS. 1 and 4 Darlington-connected transistors can be used in place of the transistor TR5.

With the phase comparison circuit as shown in FIGS. 1 and 4 D type flip-flops 10, 12 are used which are customarily used to produce a phase difference pulse signal. However, this invention is not restricted thereto. It is possible to use a circuit which is triggered, and set, by the edge of a CP input signal and reset by a reset input signal. For example, use is made of a circuit of a combination of two latch circuits which are constituted by NOR circuits G1 to G4 as shown in FIG. 9.

What is claimed is:

1. A phase comparison circuit comprising first signal generating means receiving first and second input signals and producing an output signal having a duration corresponding to a phase difference between said first and second input signals; second signal generating means for producing an output signal a predetermined time after the output signal of said first signal generating means is terminated, capacitor means, charging means connected to said capacitor means and adapted to be enabled by the output signal of said first signal generating means to cause said capacitor means to be charged, discharging means connected to said capacitor means and adapted to be enabled by said second signal generating means to discharge said capacitor means, a first transistor having its base connected to said capacitor means to produce from the emitter thereof an output signal corresponding to an amount of charge stored in said capacitor means, and switching means connected in series with a resistor between the emitter of said first transistor and a first reference power supply terminal to cause the emitter of said first transistor to be coupled to said first reference power supply terminal through said resistor.

2. A phase comparison circuit according to claim 1 in which said first signal generating means includes first and second flip-flop driven by said first and second input signals and reset means for resetting said first and second flip-flops in response to both output signals of said first and second flip-flops.

3. A phase comparison circuit according to claim 2 in which said first and second flip-flops produce high level output signals upon receipt of said first and second input signals respectively, and said reset means is constituted by an AND gate for receiving the output signals of said first and second flip-flops.

4. A phase comparison circuit according to claim 1 or 2 in which said second signal generating means includes a delay circuit for delaying said second input signal, and a NOR gate circuit for receiving the output signal of said first signal generating means, said second input signal and an output signal of said delay circuit.

5. A phase comparison circuit according to claim 1 or 2 in which said switching means is constituted by a second transistor having a collector-to-emitter path connected between the emitter of said first transistor and said first reference power supply terminal and adapted to receive said second input signal at the base.

6. A phase comparison circuit according to claim 1 or 2, further including third signal generating means for producing an output signal in response to said first input signal when said first input signal is subjected to level conversion during a time period in which an output signal is produced from said first signal generating means.

7. A phase comparison circuit according to claim 6 in which said third signal generating means comprises an inverter for inverting said first input signal and an AND gate for receiving the output signals of said inverter and said first signal generating means.

8. A phase comparison circuit according to claim 2, further including third signal generating means for producing an output signal in response to said first input signal when said first input signal is subjected to level conversion during a time period in which an output signal is produced from said first flip-flop.

9. A phase comparison circuit according to claim 8 in which said third signal generating means comprises an inverter for inverting said first input signal and an AND gate for receiving the output signals of said inverter and said first signal generating means.

10. A phase comparison circuit according to claim 8 or 9 further including an OR gate circuit for receiving the output signals of said second flip-flop and said third signal generating means.

11. A phase comparison circuit according to claim 1 or 2 in which said charging means including a transistor having an emitter-to-collector path connected in series with said capacitor means and driven by the output signal of said first signal generating means.

12. A phase comparison circuit according to claim 1 or 2 in which said discharging means includes a transistor having an emitter-to-collector path connected in parallel with said capacitor means and driven by the output signal of said second signal generating means.

13. A phase comparison circuit according to claim 1 or 2 in which said switching means is constituted by a second transistor having a collector-to-emitter path connected between the emitter of said first transistor and said first reference power supply terminal and adapted to receive said first input signal at the base.

14. A phase comparison circuit according to claim 13 in which said first input signal is a reference frequency signal having a duty cycle of 5 to 20%.

15. A phase comparison circuit according to claim 1 or 2, further including third signal generating means for receiving a synchronous signal in synchronism with said first input signal and producing an output signal in response to said synchronous signal during a time period in which an output signal is produced from said first signal generating means.

16. A phase comparison circuit according to claim 15 in which said third signal generating means includes an AND gate circuit having two input terminals for receiving said synchlonous signals and said first signal generating means.

17. A phase comparison circuit according to claim 2 further including third signal generating means for receiving a synchronous signal in synchronism with said first input signal and producing an output signal in response to said synchronous signal during a time period in which an output signal is produced from said second flip-flop.

18. A phase comparison circuit according to claim 2 further including an OR gate circuit for receiving said first input signal and an output signal from said first flip-flop and for delivering an output signal to said switching means.

19. A phase comparison circuit according to claim 2 further including a delay circuit for invertering and delaying said first input signal and a first AND gate circuit for receiving said first input signal and an output signal of said delay circuit and supplying an output signal to said switching means.

20. A phase comparison circuit according to claim 19 further including a first OR gate circuit of receiving output signals of said first AND gate circuit and said first flip-flop and for supplying an output signal to said switching means.

21. A phase comparison circuit according to claim 19 further including a second AND gate circuit for receiving said first input signal and an output signal of said second flip-flop.

22. A phase comparison circuit according to claim 21 further including a second OR gate circuit for receiving output signals of said second AND gate circuit and first flip-flop.

* * * * *